United States Patent [19]

Yokomori

[11] Patent Number: 4,807,238
[45] Date of Patent: Feb. 21, 1989

[54] A SEMICONDUCTOR LASER DEVICE
[75] Inventor: Kiyoshi Yokomori, Yokohama, Japan
[73] Assignee: Ricoh Co., Ltd., Tokyo, Japan
[21] Appl. No.: 24,585
[22] Filed: Mar. 11, 1987
[30] Foreign Application Priority Data Mar. 12, 1986 [JP] Japan .................................. 61-54122
Apr. 28, 1986 [JP] Japan .................................. 61-96674
Sep. 17, 1986 [JP] Japan .................................. 61-217079

[51] Int. Cl.⁴ ............................................... H01S 3/19
[52] U.S. Cl. ......................................... 372/32; 372/36; 372/92; 372/108
[58] Field of Search ....................... 372/36, 44, 50, 32, 372/92, 108, 98, 99, 101, 102; 357/17, 81

[56] References Cited
U.S. PATENT DOCUMENTS 4,156,206 5/1979 Comerford et al. ................. 372/108
4,297,653 10/1981 Scifres et al. .......................... 372/50

Primary Examiner—James W. Davie
Attorney, Agent, or Firm—Cooper & Dunham

[57] ABSTRACT

A semiconductor laser device having an oscillator for use in a light source containing therein a two- or three-dimensional integrated circuit semiconductor laser element. The laser device comprises a base plate having a top surface, a mask layer having a predetermined pattern provided on the top surface of the base plate, a recessed portion formed by etching the base plate through the pattern of the mask layer, a projecting portion of the mask layer extending over a part of the recessed portion, and a semiconductor laser chip having a side surface or side surfaces emitting a light beam therefrom. The light beam emitted from the side surface of the semiconductor laser chip returns after being reflected by a part of the recessed portion and a part of the projecting portion. In an alternative embodiment, the light beam emitted from the side surface of the semiconductor laser chip is reflected by the inclined plane of the recessed portion and passes through a lens means to produce an output light beam.

18 Claims, 7 Drawing Sheets

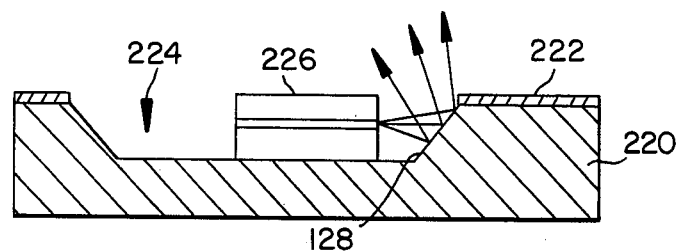
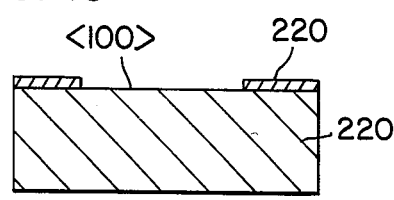
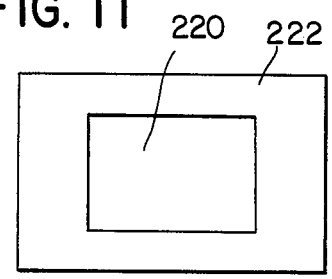
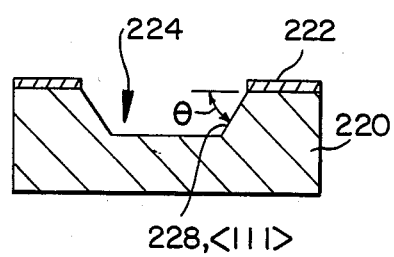
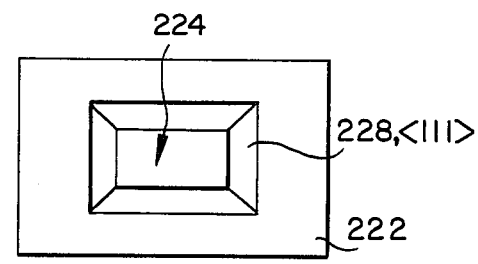

A SEMICONDUCTOR LASER DEVICE

FIELD OF THE INVENTION

This invention relates to a semiconductor laser and more particularly to an oscillating device useful in a light source using an integrated circuit semiconductor laser.

BACKGROUND OF THE INVENTION

A semiconductor laser device which emits light in a direction perpendicular to the top surface of a base plate can be useful in a two- or three-dimensional integrated circuit. Such a laser device prevents interference between a flat base plate and a divergent output light beam from the laser. A surface-emitting semiconductor laser emitting a light beam from its side surface can be used to emit light perpendicular to its base; however its gain (because of its short resonator) limits its practical use. Another device which can emit light perpendicular to a base plate is described in Appl. Phys. Let. 46 (2), Jan. 15, 1985, pages 115–117, and is illustrated in FIG. 1a of this specification. It comprises an etched-cavity laser emitting a beam in a direction perpendicular to its base plate. As seen in FIG. 1a, a base plate 52 of InP supports an etch-stop layer 54, InP buffer layer 56, GaInAsp activating layer 58, InP cap layer 60 and a mask 62, in the stated order. Selective chemical etching is done in two steps to form an etched cavity having a curved reflective plane 64. After heating the structure at 690°–740° C. the semiconductor laser device depicted in FIG. 1a is obtained. Reference 80 is a heat sink. Such a semiconductor laser device can be made as an integral structure, but it has some disadvantages. For example the manufacturing process is complicated due to the use of two etching steps and it is difficult to form the reflective plane.

When a semiconductor laser is used as a light source, difficulties can arise from mode jumps in the oscillating wavelength due to ambient temperature changes. One prior art technique to stabilize such wavelength changes is depicted in FIG. 1b, where a divergent light beam emitted from the side portion 32 of a semiconductor laser 3 passes through a collimator lens 8 and emerges as a parallel beam. The parallel beam is reflected by an exterior mirror 9 and then passes through the collimator lens 8 again, in the opposite direction, thereby returning to the semiconductor laser. The wavelength can be thereby stabilized, but a large scale optical unit is used, and the stabilization of the oscillating wavelength against mode jumps can be effectively obtained over a wide range of ambient temperature changes.

SUMMARY OF THE INVENTION

An object of the invention is to provide a useful device which emits light in a direction perpendicular to the top surface of a base plate.

Another object of the invention is to provide a semiconductor laser device having a relatively wide temperature range in which there is no mode jump in oscillating wavelength.

In order to achieve such objects in the first aspect of the invention, there is provided a semiconductor laser device which includes a base plate, a mask layer having a predetermined pattern formed on a surface of said base plate, a recessed portion of said base plate formed by an etching process using said mask layer, said recessed portion having a reflective plane, and a separately manufactured semiconductor laser chip means is disposed on said recessed portion, wherein light emitted from said chip means is reflected by said reflective plane to produce an output light emitted in a direction substantially perpendicular to said base plate.

In order to achieve such objects, in the second aspect of the invention there is provided a semiconductor laser wavelength stabilizing device which includes a base plate, a mask layer having a predetermined pattern formed on a surface of said base plate, a recessed portion in said plate formed by an etching process using said mask layer, a projecting portion extending from a part of said mask layer toward an upper part of the recessed portion, and a semiconductor laser chip; wherein a light beam emitted from one side of said semiconductor chip is returned thereto after being reflected from parts of the recessed portion and said projecting portion.

BRIEF DESCRIPTION OF THE DRAWING

FIG. 9 is a schematic sectional view showing a semiconductor laser device according to this invention;

FIGS. 10 and 12 are sectional views showing a base plate in two manufacturing steps;

FIGS. 11 and 13 are plan views of FIGS. 10 and 12, respectively;

DETAILED DESCRIPTION OF PREFERRED EMBODIMENTS

According to this invention, a mask layer having a predetermined pattern is formed on the top surface of a base plate 1. This base plate 1 has therein a recessed portion formed by etching through a mask defined by a mask layer. A part of the mask layer extends over the recessed portion to form a projecting portion. In this invention, wavelength stabilization of the semiconductor laser can be achieved by using both the recessed portion and the projecting portion to reflect light emitted by the laser chip back to a side portion of the laser chip. In the preferred embodiments, the semiconductor laser chip is disposed within the recessed portion, on the bottom of the recess. The etching of the base plate can be performed by an isotropic process or an anisotropic process or by a combination thereof. Such etching can form an inclined planar or curved side wall of the recessed portion.

This invention utilizes as a reflecting surface a part of a side wall of the recess formed by etching. Further, a part of the projecting portion can overhang the recess, and therefore it can be used as a reflecting surface or for other purposes.

Figure 2:
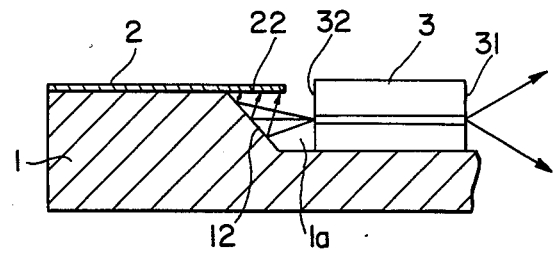
FIG. 2 is a schematic view showing a semiconductor laser wavelength stabilizing device according to one embodiment of the invention.

Next is an explanation of preferred embodiments of the device according to the present invention. FIG. 2 shows a semiconductor laser wavelength stabilizing device according to one embodiment of the invention. A base plate 1, which is flat, can comprise a single crystal material such as Si or GaAs. A mask layer of Si Nitride (for instance) is formed on the top surface of the base plate 1. A recessed portion 1a of the base plate 1 is formed by etching the plate 1, using as a mask a predetermined pattern of the mask layer 2. The recessed portion is defined by a planar bottom portion and a side wall upwardly extending from the bottom. A separately manufactured semiconductor laser chip 3 can be bonded to the surface of the bottom portion. The etching process can be such that a part of the mask layer 2 extends over the recess to form a projecting portion 22. This projecting portion 22 can result at least in part from the undercut phenomenon inherent in an etching process.

In such a structure, light emitted from one side 32 of a semiconductor laser chip is reflected by an inclined plane 12 of the recessed portion 1a, which plane slants relative to the surface of the base plate 2 as a result of the etching process. The light reflected by inclined plane 12 is again reflected by the projecting portion 22 of the mask 2 and is directed back to the side portion 32 of the chip, through the same optical path but in an opposite direction. This optical path forms an external resonator comprising both sides 31 and 32 of the chip 3, the inclined plane 12 and the projection portion 22 of the mask layer 2. Such a device can use a relatively small distance between the side portion 32 and the projecting portion 22. For example, a distance from a few tens of microns to a few hundreds of microns can be used. Accordingly, such a device can have a wide temperature range in which no mode jumps occur due to ambient temperature changes.

Figure 3:
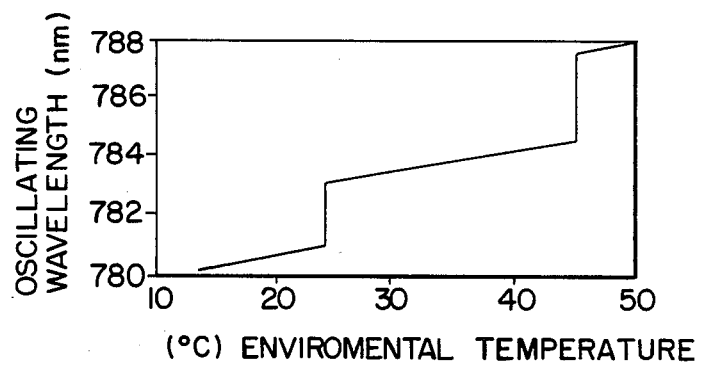
FIG. 3 is a graph showing one example of a characteristic of a device according to the invention.

FIG. 3 is a graph of test results illustrating the change in oscillating wavelength in the ambient temperature range between 15° C. and 50° C. at distance of 100 micron between the side wall 32 of the CaAlAs semiconductor laser chip and the projecting portion 22. As seen from the graph, no mode jump occurs within the relatively wide range between 25° C. and 45° C., and the oscillating wavelength is satisfactorily stabilized in this range by using the above device according to the invention.

Figure 4A:
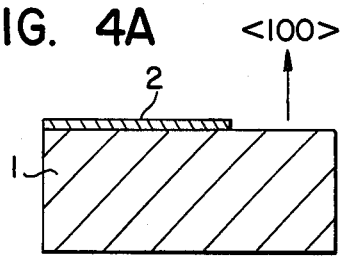
FIGS. 4a, 4b, 5a, and 5b are schematic views showing one example of a method of manufacturing the device of FIG. 2.
Figure 5A:
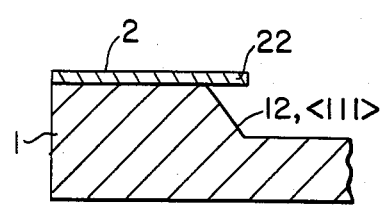
Figure 5B:
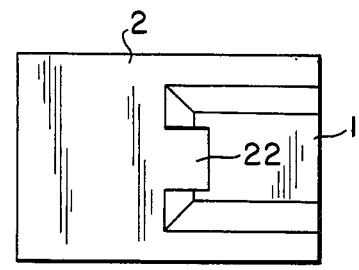

As shown in FIG. 4a, a mask layer 2 is made by sputter deposition of $Si_3N_4$ onto the upper surface of the Si base plate 1 to form a substantially rectangular shape. The upper surface of the plate 1 has crystal orientation (100). By utilizing well known photolithography, a preselected portion of the mask layer 2 is removed to form a predetermined pattern. In this embodiment, the shape of the projecting portion 22 is defined in the course of forming the pattern of the mask layer 2. Next, the Si base plate 1 is etched anisotropically through the mask pattern in order to form the desired recess into the surface of the base plate 1. In this embodiment, a liquid mixture of KOH, Isopropyl Alcohol and $H_2O$ can be used. FIGS. 5a and 5b show the resulting structure. Etching proceeds along the orientation (111) of the base plate 1 in this case, so that along the orientation (111) an inclined plane 12 is formed at the side wall 12 of the recessed portion. Upon completion of etching, a projecting portion 22 overhangs the recessed portion. After that, Au is deposited by vapor deposition (vacuum evaporation) over the exposed surfaces, to improve light reflection from the inclined plane 12 and the underside of the projecting portion 22. Although not illustrated in the drawings, a semiconductor laser chip means of the GaAlAs family, separately manufactured through another process, is bonded onto the bottom of the recessed portion. In this case, the placement of the chip is such that light emitted from one side of the chip is reflected by the plane 12 and by the underside of the portion 22, in this order, and impinges on the same side of the chip through the same optical path in reverse direction.

Figure 4B:
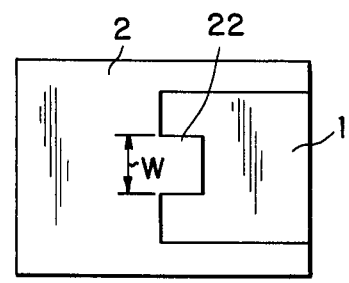
Figure 6A:
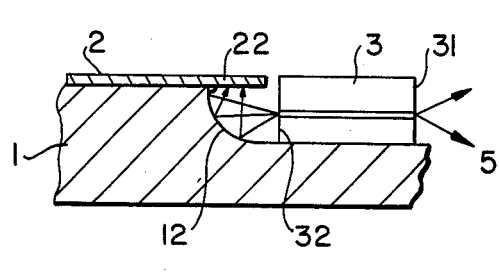
FIGS. 6a and 6b are schematic views showing a wavelength stabilizing device for a semiconductor laser according to another embodiment of the invention.
Figure 6B:
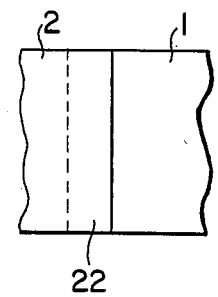

As described before, since the amount of undercut is relatively small in anisotropic etching, a mask pattern suitable for such a projecting portion is formed and the projecting portion 22 is obtained by undercutting from the relevant three directions as shown in FIGS. 4b and 5b. However, in case that etching gives enough undercut or in case that the desired projecting portion can be achieved by changing the etching process, such a mask pattern for etching from three directions may not be necessary. For instance, an isotropic etching process can be used to etch the base plate 1. In this case, the above-described mask shape is not always necessary. Since isotropic etching proceeds at the same rate to all directions regardless of the crystal orientation of the plate 1, enough undercut can be obtained and a projection portion 22 of suitable length is formed by the undercut action along the side portion of the mask layer 2 as shown in FIG. 6b. In isotropic etching, the side wall of the recessed portion becomes a curved plane rather than a flat plane as shown in FIG. 6a. It can be preferable to use a liquid mixture of HF, $HNO_3$, $H_2O$, and $CH_3COOH$ as the etching liquid in isotropic etching. Further, a metal material such as Au or Cu can be deposited onto surfaces which reflect the laser beam, such as on the side wall of the recessed portion and/or on the underside of the projecting portion in order to improve their reflection characteristics.

Figure 7:
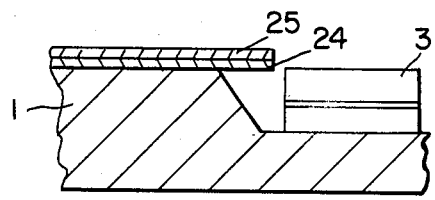
FIG. 7 is a schematic view showing a semiconductor laser wavelength stabilizing device according to another embodiment of the invention.

Advantages can be obtained when the mask layer 2, especially its projecting portion 22, comprises highly reflective materials, to the extent possible, in order to efficiently reflect the laser beam. For example, the mask layer itself may comprise metal materials such as Au or Cr. In the above embodiment, since the mask layer 2 is made of NiSi, Au material is vapor-deposited (vacuum-evaporated) onto its surface, especially the underside. In order to improve the reflection characteristics, the mask layer 22, especially the projecting portion 22, can include two layers, as shown in FIG. 7. As an example, there is provided a mask means including a dielectric layer 24 of NiSi and thereon a metallic layer 25 of Au, the optical thickness of the dielectric layer being fixed to half the wavelength of the semiconductor laser. The optical thickness in this case is the product of the thickness and the refractive index of the dielectric material.

A modified embodiment is described with reference to FIGS. 8a and 8b. The mask layer 2 having a predetermined pattern is formed on the surface of the base plate 1. A recessed portion is formed in the base plate 1 by an etching process using the mask layer 2, and a selected portion of the mask layer 2 overhangs the recessed portion as a projecting portion 22. A semiconductor laser chip 3 means is bonded at the bottom of the recessed portion. Light emitted from one side of the chip 3 is reflected by the inclined wall of the recessed portion and the projecting portion 22, in the specified order, and returns to the same side of the chip 3. In this modified embodiment, light emitted from the other side 31 of the chip 3 is reflected by an opposing inclined plane 11 to render the direction of the reflected light substantially perpendicular to the surface of the base plate 1. A mask layer of the shape shown in FIG. 6 is useful in this embodiment. This structure can be used as the light source of a photo-integrated circuit means of two- or three-dimensional type.

Next is an explanation of another embodiment of this invention. FIG. 9 is a schematic view of a semiconductor laser device according to one embodiment of this invention. A base plate 220 comprises a semiconductor material such as Si, GaAs, or GaP in single crystal form. On the top surface of the base plate 220 is formed a mask layer 222 which comprises, for example, SiO$_2$, Si$_3$N$_4$, Au, or Cr. As seen in FIG. 9, a recessed portion 224 is formed. A separately manufactured semiconductor laser chip means 226 is bonded at the bottom area of the recessed portion 224. At a side wall of the recessed portion 224, there is provided an inclined plane 228 to direct reflected light perpendicularly to base plate 220.

A manufacturing method for the recessed portion 224 and the inclined plane 228 is described below. SiO$_2$ is used to form a mask layer 222. It is deposited onto the top surface of the base plate 220 of Si by sputtering or thermal oxidation. After that, a part of the mask layer 222 is removed by a prior art photolithoghraphic technique. The size of the area to be removed is determined by the size of the semiconductor laser chip means.

In this embodiment, a rectangular part of the mask 222 is removed, as shown in FIGS. 10 and 11. The crystal surface (100) of the Si base plate 220 is exposed thereby. Following that action, the Si crystal layer is etched through the removed portion of the mask layer, using an anisotropic process. A liquid mixture of KOH, Isopropyl alcohol and H$_2$0 can be used as the etchant. As a result, the recessed portion 224 is formed in trapezoidal shape, as seen in FIGS. 12 and 13. Etching proceeds along the crystal orientation (111) to thereby form an inclined plane 228 at each side of the recessed portion 224. Each plane 228 has an angle of 54.74° relative to the crystal surface (100). A semiconductor chip means 226 separately manufactured produced by another process is placed onto the exposed crystal surface (100) and is fixed (e.g. bonded)? at the position at which light is emitted therefrom and the emitted light; is reflected by the inclined plane 228 to direct the reflected light upwardly in relation to the base plate 220. In order to improve reflection, a reflective film of Au, for example, is vapor-deposited (vacuum-evaporated) on the reflecting plane 228. A liquid mixture of ethyldiamine, pyrocatechol and H$_2$0 can be used as an etchant. In this embodiment, the reflecting surface has the (111) crystal orientation while the top surface of the base plate has the (100) orientation as an alternative, the reflecting surface can have the (111) orientation, while the base plate top surface has the (110) orientation. As is understood from the foregoing explanation, the inclined plane for reflection and the location where the semiconductor is to be placed, can be easily obtained by using isotropic etching. The separately manufactured laser chip can be secured to a heat-sink member of Si or Cu, for example. As an alternative, a heat-sink capability can be incorporated into the base plate structure.

Figure 14:
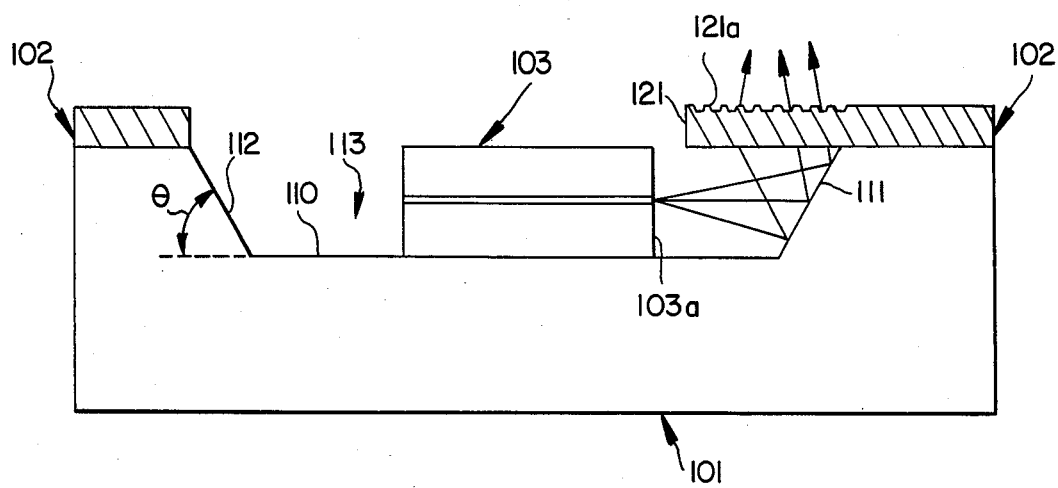
FIG. 14 is a side view showing one embodiment of a semiconductor laser device according to this invention.

Next is an explanation of another device according to this invention. FIG. 14 is a sectional view showing one embodiment of a semiconductor laser device with an integral lens structure according to this invention. On one surface of a base plate 101 of a single crystal material such as Si or GaAs is formed a mask layer 102, a part of which has been removed to form the pattern necessary for the function of this device. A part of the base plate 101 is removed in accordance with the pattern of the mask layer 102 by isotropic etching to form a recessed portion 113 in the base plate 101. The recessed portion is defined by a planar bottom area 110 and inclined planes 111 and 112 which extend upwardly from the base bottom area 110. Further, a separately manufactured semiconductor laser chip means 103, produced for example by epitaxial growth, is disposed (e.g. bonded) on the bottom area 110 of the plate 101. In the course of etching the base plate 101, the undercut phenomenon forms a projecting portion 121 which is part of the mask layer and overhangs the inclined plane 111. A grating lens 121a is formed in or mounted on the outer (upper) surface of the projecting portion 121. A laser beam emitted from a side portion 103a of the chip means 103 is reflected by the inclined plane 111 opposing to the portion 103a. The plane 111 directs the laser beam upwardly, perpendicularly or at least transversely to the surface of the base plate 101, and thus directed beam passes through the grating lens 121a to produce a suitable output light beam. Since the grating lens 121a is formed in or mounted on the projecting portion 121 of mask layer 102 in this embodiment, there is no need to dispose a lens means remote from the base plate 101 and the mask layer 102 and, accordingly, an optical unit using this structure can be relatively small in size.

Figure 15:
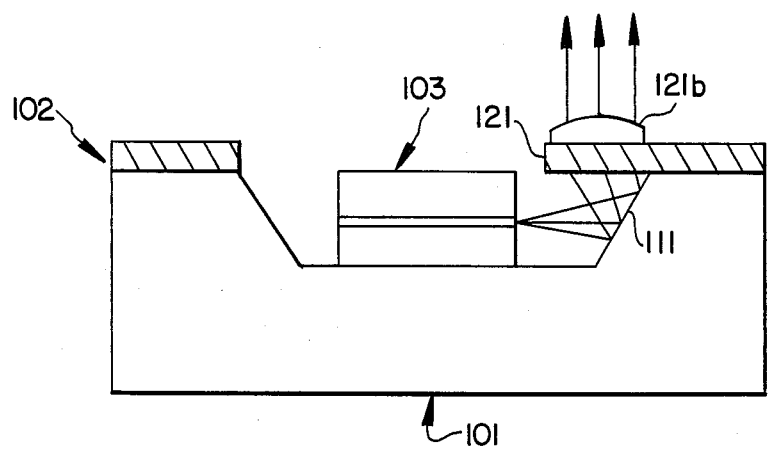
FIG. 15 is a sectional view showing another embodiment of a semiconductor laser device according to this invention.
Figure 16:
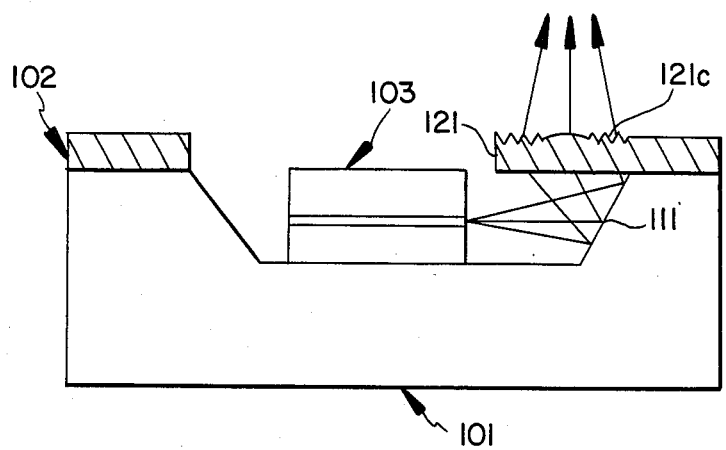
FIG. 16 is a sectional view showing another embodiment of a semiconductor laser device according to this invention.
Figure 17:
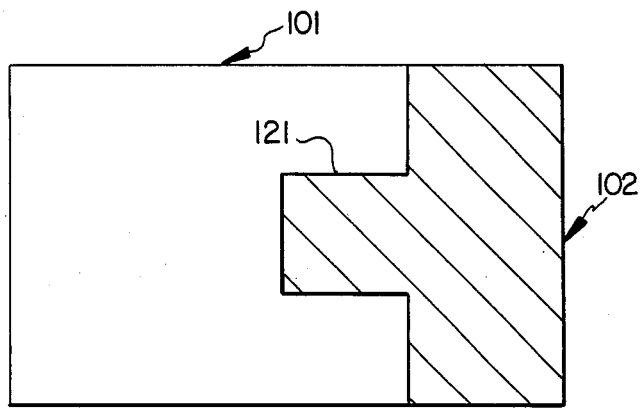
FIG. 17 is a plan view showing one example of a mask pattern used in a manufacturing step of the semiconductor laser device of FIG. 14.

A mask layer having a pattern as shown in FIG. 17 can be used in this embodiment. Also, a spherical lens, a non-spherical lens, or a Fresnel lens can be used in place of the grating lens 121a. FIG. 15 shows an example of a non-spherical lens 121b as a lens means formed on the projecting portion 121 of the mask layer 102. The non-spherical lens can be of a dielectric material such as glass formed on the surface of the mask layer 102 by sputtering, vapor or chemical vapor-phase deposition (CVD). FIG. 16 shows an example of a Fresnel lens 121c formed on the projecting portion 121 of the mask layer 102. The Fresnel lens 121c can be formed by directly etching the mask layer 102 using a photolithographic technique. The grating lens 121a of FIG. 14 and the Fresnel lens 121c of FIG. 16 can be formed by the steps of providing a dielectric layer on the mask layer 102 and etching the dielectric layer.

Figure 18A:
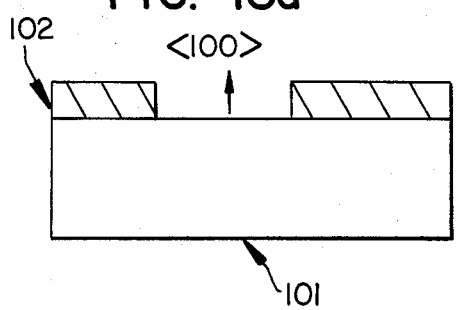
FIGS. 18a, 18b, 19a, 19b, 20a and 20b are sectional and plan views showing manufacturing steps of the semiconductor laser device of FIG. 14.
Figure 18B:
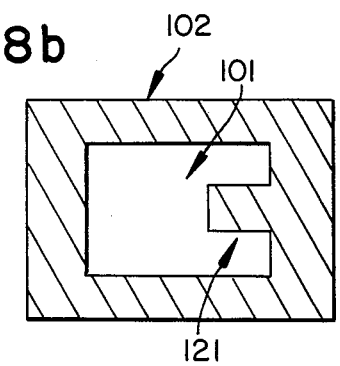
Figure 19A:
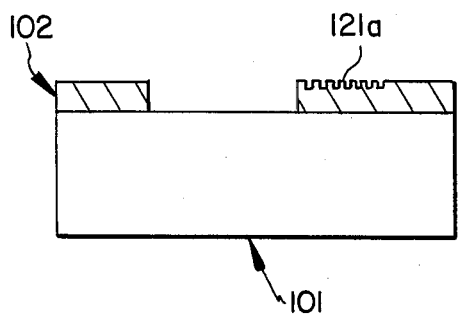
Figure 19B:
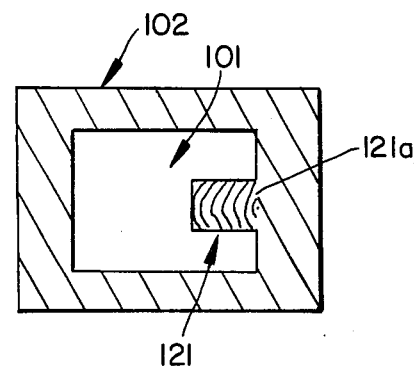
Figure 20A:
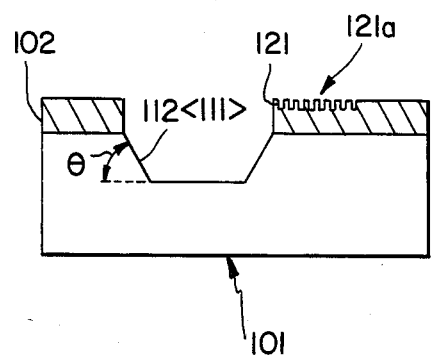
Figure 20B:
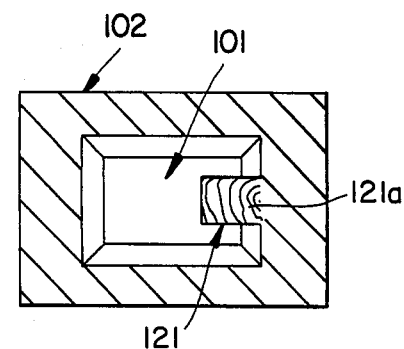

A manufacturing method for the integral lens semiconductor laser device of FIG. 14 is shown in FIGS. 18a–20b, where part (a) is a sectional view and part (b) is a plan view. A mask layer 102 made of $Si_3N_4$ is formed onto the main surface of a base plate 101 of Si by sputtering. The crystal orientation (100) can be used for the main (top) surface of the Si base plate. Next, a part of a mask layer 102 is removed by a photolithographic technique, as shown in FIGS. 18a and 18b, to form a projecting portion 121. After that, a grating lens means 121a is formed in or mounted on the projecting portion 121 of the mask layer 102 in order to produce a suitable output beam of the semiconductor laser device, as shown in FIGS. 19a and 19b. The grating lens 121a is produced by using a photolithographic technique, namely by the steps of coating the surface of the projecting portion 121 with photoresist material, exposing it, such as with the interference pattern of two light beams, with ultraviolet radiation through a pattern mask or by electron beam scanning, developing and washing the photoresist and etching the exposed surface of the mask layer 102 to form the desired lens. A liquid mixture of hydrofluoric acid and ammonium fluoride can be used as an etchant for the mask layer of $Si_3N_4$ so as not to etch the base plate 101 of Si when etching the mask layer 102 of $Si_3N_4$.

Figure 1A:
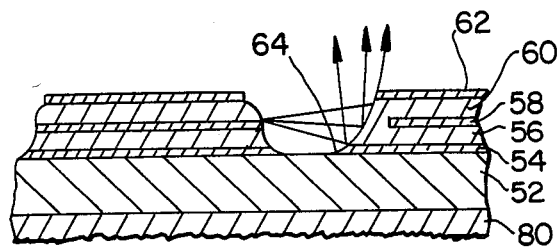
FIG. 1a is a cross-sectional view of a prior art semiconductor laser device.
Figure 1B:
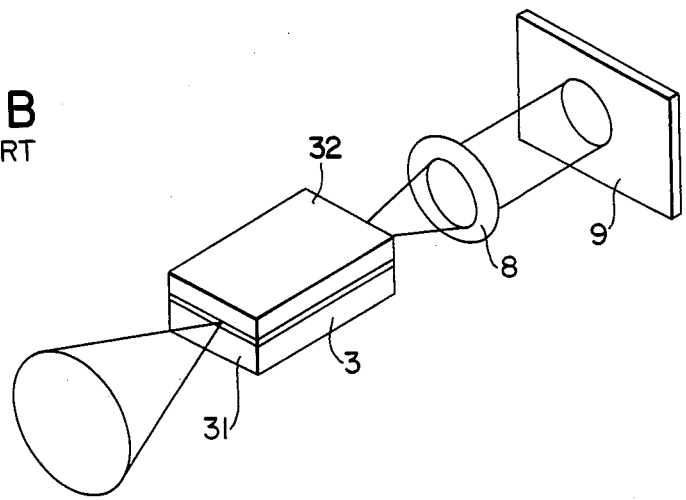
FIG. 1b is a perspective view of a prior art semiconductor laser wavelength stabilizing device of prior art.
Figure 8A:
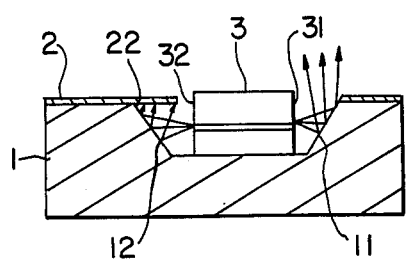
FIGS. 8a and 8b are schematic views showing semiconductor laser a wavelength stabilizing device according to a further embodiment of the invention.
Figure 8B:
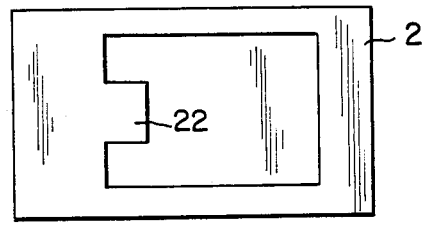
Figure 21:
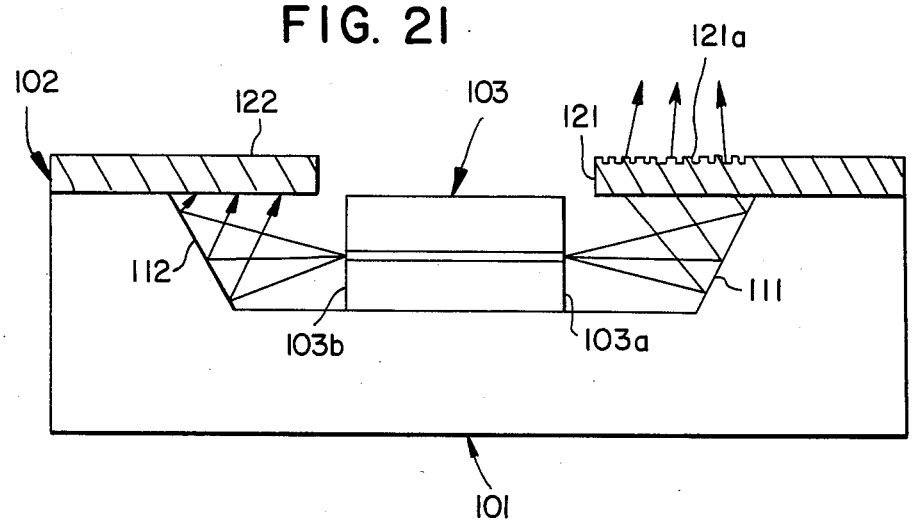
FIG. 21 is a sectional view showing another embodiment of a semiconductor laser device according to this invention.
Figure 22:
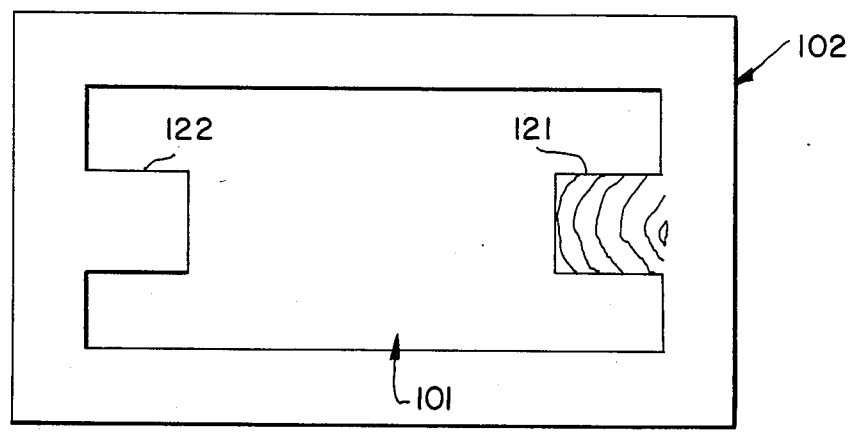
FIG. 22 is a plan view showing the mask pattern of the semiconductor laser device of FIG. 21.

FIG. 21 shows an embodiment which is similar to that of FIG. 8a but adds a grating lens 121 which is similar to lens 121a in FIG. 14. Except for the use of lens 121, the embodiment of FIG. 21 works in a manner similar to that discussed in connection with FIG. 8a (i.e., the correspondence of elements is 102-2, 122-22, 103-3 and 101-1). Grating lens 121 in FIG. 21 performs the function discussed in connection with grating lens 121a in FIG. 14. FIG. 22 shows in top plan view the mask pattern of the FIG. 21 device, including the projecting portion 122 of mask layer 102 and grating lens 121.

What is claimed is:

1. A semiconductor laser device for stabilizing the wavelength of a semiconductor laser beam which comprises:
   (a) a base plate having a top surface;
   (b) a mask layer having a predetermined pattern provided on said top surface of said base plate;
   (c) a recessed portion formed by etching said base plate through said pattern of said mask layer;
   (d) a projecting portion of said mask layer extending over a part of said recessed portion; and
   (e) semiconductor laser chip means having a first side emitting a light beam therefrom and a second side;
   wherein the light beam emitted from said first side of said semiconductor chip means returns thereto after being reflected by a part of said recessed portion and a part of said projecting portion and wherein the optical path of said light beam is in an external resonator comprising both the first and second sides of said semiconductor laser chip means and said projecting portion of said mask layer.

2. A device according to claim 1, in which said semiconductor laser chip means is disposed within said recessed portion.

3. A device according to claim 2, in which said semiconductor laser chip means is disposed on a bottom portion of said recessed portion.

4. A device according to claim 1, in which said part of said recessed portion comprises a first inclined plane formed by etching the base plate.

5. A device according to claim 4, in which said first inclined plane comprises a two-dimensionally curved plane.

6. A device according to claim 1, in which said projecting portion is formed by undercutting in the course of said etching of the base plate.

7. A device according to claim 1, in which said projecting portion and said side of said semiconductor laser chip means serve as portions of a resonator means.

8. A device according to claim 1, which includes a reflective material provided at least at one of said part of said projecting portion and said part of said recessed portion.

9. A device according to claim 1, in which said mask layer comprises a dielectric layer and a metallic layer formed thereon, wherein the optical thickness of said dielectric layer approximates a half wavelength of said semiconductor laser chip means.

10. A device according to claim i, which includes a second inclined plane opposite said first inclined plane, and said second side of said semiconductor laser chip means emits a light beam which is reflected by said second inclined plane in a direction substantially perpendicular to said base layer member.

11. A semiconductor laser device which comprises:
   (a) a base plate having a top surface;
   (b) a mask layer having a predetermined pattern provided on said top surface of said base plate;
   (c) a recessed portion which is formed on said base plate by etching using said pattern of the mask layer, said recessed portion having a first inclined plane for reflection;
   (d) first projecting portion extending from a part of said mask layer toward and partly over said recessed portion;
   (e) a lens means formed on said first projecting portion; and
   (f) a semiconductor laser chip means disposed on said recessed portion and having a first side emitting a light beam therefrom;
   wherein light beam emitted from said first side of said semiconductor laser chip means is reflected by said first inclined plane of said recessed portion at a predetermined angle and passes through said lens means to produce an output light beam.

12. A semiconductor laser device which comprises:
   (a) a base plate having a top surface;
   (b) a mask layer having a predetermined pattern provided on said top surface of said base plate;
   (c) a recessed portion which is formed in said base plate by etching using said pattern of the mask layer, said recessed portion having a first inclined plane and a second inclined plane respectively for reflection, and said second inclined plane being opposite said first inclined plane;
   (d) a first projecting portion extending from a part of said mask layer toward and partly over said recessed portion;
   (e) a lens means formed on said first projecting portion;
   (f) a semiconductor laser chip means disposed on said recessed portion and having a first side and a second side respectively emitting a light beam therefrom, said second side being opposite said first side; and (g) a second projecting portion extending from a part of said mask layer opposite said first projecting portion toward and partly over said recessed portion;

wherein light beam emitted from said first side of said semiconductor laser chip means is reflected by said first inclined plane of said recessed portion at a predetermined angle and passes through said lens means to produce an output light beam, and at the same time, light is emitted from said second side of said semiconductor laser chip means and returns thereto after being reflected by said second inclined plane and said second projecting portion, and wherein the optical path of said light is in an external resonator comprising both sides of said semiconductor laser chip means and said first and second projecting portions of said mask layer.

13. A semiconductor laser device according to claim 12, in which said lens means comprises a Fresnel lens.

14. A semiconductor laser device according to claim 12, in which said lens means comprises a grating lens.

15. A semiconductor laser device according to claim 12, in which said lens means comprises dielectric material.

16. A semiconductor laser device according to claim 11, in which said lens means comprises a Fresenel lens.

17. A semiconductor laser device according to claim 11, in which said lens means comprises a grating lens.

18. A semiconductor laser device according to claim 11, in which said lens means comprises dielectric material.

* * * * *